United States Patent [19]

Badesha et al.

[11] Patent Number: 4,894,307

[45] Date of Patent: Jan. 16, 1990

[54] PROCESSES FOR PREPARING AND CONTROLLING THE FRACTIONATION OF CHALCOGENIDE ALLOYS

[75] Inventors: Santokh S. Badesha, Pittsford; Geoffrey M. T. Foley; Paul Cherin, both of Fairport, all of N.Y.

[73] Assignee: Xerox Corporation, Stamford, Conn.

[21] Appl. No.: 270,184

[22] Filed: Nov. 4, 1988

[51] Int. Cl.$^4$ ............................................. G03G 5/082
[52] U.S. Cl. ..................................... 430/128; 430/136; 423/508
[58] Field of Search .............. 430/128, 136, 135; 75/0.5 A; 420/579, 590; 423/508, 510

[56] References Cited

U.S. PATENT DOCUMENTS

| | | | |
|---|---|---|---|
| 3,785,806 | 1/1974 | Henriksson | 75/134 H |
| 4,015,029 | 3/1977 | Elchisak | 427/76 |
| 4,205,098 | 5/1980 | Kobayashi et al. | 427/76 |
| 4,414,179 | 11/1983 | Robinette | 420/579 |
| 4,484,945 | 11/1984 | Badesha et al. | 75/0.5 A |
| 4,513,031 | 4/1985 | Leder | 427/250 |
| 4,583,608 | 4/1986 | Field et al. | 148/1 |
| 4,585,621 | 4/1986 | Oda et al. | 420/579 |
| 4,632,849 | 12/1986 | Ogawa et al. | 427/215 |
| 4,710,442 | 12/1987 | Koelling et al. | 430/85 |
| 4,780,386 | 10/1988 | Hordon et al. | 430/58 |

FOREIGN PATENT DOCUMENTS

| | | |
|---|---|---|
| 57-91567 | 6/1982 | Japan . |
| 60-172346 | 9/1985 | Japan . |
| 656486A5 | 2/1984 | Switzerland . |

*Primary Examiner*—John L. Goodrow
*Attorney, Agent, or Firm*—E. O. Palazzo

[57] ABSTRACT

A process for the preparation of chalcogenide alloys which comprises providing a chalcogenide alloy source component, crystallizing the source component, and evaporating the source component in the presence of an organic component.

35 Claims, No Drawings

PROCESSES FOR PREPARING AND CONTROLLING THE FRACTIONATION OF CHALCOGENIDE ALLOYS

BACKGROUND OF THE INVENTION

The present invention relates to processes for preparing and controlling the fractionation of chalcogenide alloys. More specifically, the present invention relates to processes for controlling the fractionation of chalcogenide alloys during the vacuum deposition thereof. In one embodiment, the present invention is directed to a process for controlling and suppressing the fractionation of chalcogenide alloys which comprises the crystallization or partial crystallization of said chalcogenide alloy, and subsequently vacuum evaporating in the presence of an organic component such as polysiloxanes, a siloxane polymer, a long chain hydrocarbon containing, for example, up to about 35 carbon atoms, and the like, thereby enabling, for example, desirable homogeneous products. The products resulting from the process of the present invention can be selected as photoconductors in electrophotographic imaging systems, including xerographic imaging and printing processes.

Chalcogens and chalcogenide alloys, and their use in electrophotographic processes is known. Generally, the aforementioned photoconductors are prepared by known vacuum deposition, flash evaporation, and chemical vapor deposition methods. These methods possess disadvantages in some instances. Thus, for example, with vacuum deposited chalcogenide alloys the products obtained lack controllable reproducibility in their homogeneity thereby adversely affecting the electrophotographic electrical characteristics thereof. As the components selected for vacuum deposition usually have different vapor pressures, such components tend to separate during the vacuum deposition process causing undesirable inhomogeneity, or fractionation thereof. Also, in the vacuum deposition processes the components or species with for example high selenium content tend to evaporate more rapidly during the initial stages of deposition primarily, it is believed, because of their higher partial vapor pressure, thus resulting in uncontrolled, undesirable fractionation. Accordingly, for example, the final photoconductor will contain less selenium on the top surface which adversely affects the electrical characteristics thereof, and adds significantly to the cost of the process. With the processes of the present invention these and other disadvantages are avoided.

Electrophotographic photoconductive imaging members containing amorphous selenium can be modified to improve panchromatic response, increase speed and to improve color copyability. These improved members are usually comprised of chalcogenide alloys such as alloys of selenium with tellurium and/or arsenic. The selenium imaging members may be fabricated as single layer devices comprising a selenium-tellurium, selenium-arsenic, selenium antimony, or selenium-tellurium-arsenic alloy layer which functions as a charge generation and charge transport medium. The selenium electrophotographic imaging members may also comprise multiple layers such as, for example, a selenium alloy transport layer and a continuous selenium alloy generator layer.

One known process for the preparation of photoconductors comprises the vacuum deposition of a selenium alloy on a supporting substrate such as aluminum. Tellurium can then be incorporated therein as an additive primarily for the purpose of enhancing the spectral sensitivity thereof. Also, arsenic can be incorporated as an additive for the primary purpose of improving wear characteristics, passivating against crystallization and improving electricals of the resulting photoconductor. Generally, the tellurium addition can be incorporated as a thin selenium-tellurium alloy layer deposited over a selenium arsenic alloy layer to achieve the benefits of the photogeneration and transport characteristics of these respective layers. Fractionation of chalcogenide alloys, such as tellurium and/or arsenic composition, during the vacuum evaporation processes results in an undesirable concentration gradient in the deposited photoconductor. Accordingly, there results inhomogeneities (fractionation) in the stoichiometry of the vacuum deposited thin film alloys. More specifically, fractionation occurs, it is believed, as a result of differences in the partial vapor pressure of the molecular species of the solid and liquid phases of binary, ternary and other multicomponent alloys. An important aspect in the generation of chalcogenide alloys is controlling the fractionation of alloy components such as tellurium and/or arsenic during the evaporation of source alloys. More specifically, tellurium and/or arsenic fractionation control is particularly important since the tellurium and/or arsenic concentration at the extreme top surface of the resulting photoconductor effects xerographic sensitivity, charge acceptance, dark discharge, copy quality, photoreceptor wear, yield, crystallization resistance, and the like. For example, in single layer low arsenic selenium alloy photoreceptors arsenic enrichment at the top surface caused by fractionation can also cause severe reticulation of the evaporated film. Further, in single layer tellurium selenium alloy photoreceptors, tellurium enrichment at the top surface due to fractionation can cause undue sensitivity enhancement, poor charge acceptance and enhancement of dark discharge. Also, in two layer or multilayer photoreceptors where low arsenic alloys may be incorporated as a transport layer, arsenic enrichment at the interface with the layer above can lead to residual cycle up problems. Moreover, in two layer or multilayer photoreceptors where tellurium alloys may be incorporated as a generator layer, tellurium enrichment at the upper surface of the tellurium alloy layer can result in similar undue sensitivity enhancement, poor charge acceptance, and enhancement of dark discharge.

One specific method of preparing selenium alloys for evaporation comprises the grinding of selenium alloy shot (beads) and compressing the ground material into pellet agglomerates, typically from about 150 to about 300 milligrams in weight and having an average diameter of about 6 millimeters (6,000 micrometers). The pellets are then evaporated from crucibles in a vacuum coater with a time/temperature crucible program designed to minimize the fractionation of the alloy during evaporation. One disadvantage of the aforementioned vacuum deposited photoconductors, such as selenium-tellurium alloy layer, is the crystallization of the selenium-tellurium alloy at the surface of the layer when exposed to heat. To retard premature crystallization and extend photoreceptor life, the addition of up to about 5 percent arsenic to the selenium-tellurium alloy can be beneficial without impairment of xerographic performance.

Also, in deposited layers of selenium tellurium alloys the amounts of top surface tellurium present can cause excessively high photosensitivity. This photosensitivity is variable and changes as the surface of the layer wears away. Surface injection of corona deposited charge and thermally enhanced bulk dark decay involving carrier generation cause the toner images in the final copies to exhibit a washed out, low density appearance. Excessive dark decay causes loss of high density in solid areas of toner images and a general loss of image density. For example, when the photoreceptor comprises a single layer selenium arsenic alloy, about 1 to about 2.5 percent by weight arsenic, based on the weight of the entire layer at the surface of the alloy layer, there is provided protection against surface crystallization. When the concentration of arsenic is greater than about 2.5 percent by weight, electrical instability risks increase.

One known method for attempting to control fractionation is the selection of shutters for incorporation over the evaporation crucibles. The tellurium or arsenic rich material originating from the crucible deposits on the shutter rather than on the photoreceptor substrate. However, in planetary coating systems, installation of shutters is complex, difficult and expensive. Further, after one or more coatings it may be necessary to clean the surface of the shutters and the resulting debris can cause defects to occur in subsequently formed photoreceptor layers.

Accordingly, a problem encountered in the fabrication of chalcogenide alloy photoconductors, such as selenium alloy photoreceptors, is the fractionation or preferential evaporation of an alloy component whereby the resulting film composition is not equivalent to the source alloy. Thus, the deposited film or layer does not have a uniform composition extending from one surface to the other. For example, when tellurium is the dopant, the tellurium concentration is high at the top surface and can approach zero at the bottom surface in contact with the substrate of the vacuum deposited layer. This problem is also observed for alloys of Se-Te, Se-As, Se-As-Te, Se-As-Te-Cl, or other halogens, mixtures thereof, and the like.

In U.S. Pat. No. 4,770,965, the disclosure of which is totally incorporated herein by reference, there is illustrated a process which includes heating an alloy comprising selenium and from about 0.05 percent to about 2 percent by weight arsenic until from about 2 percent to about 90 percent by weight of the selenium in the alloy is crystallized, vacuum depositing the alloy on a substrate to form a vitreous photoconductive insulating layer having a thickness of between about 100 micrometers and about 400 micrometers containing between about 0.3 percent and about 2 percent by weight arsenic at the surface of the photoconductive insulating layer facing away from the conductive substrate, and heating the photoconductive insulating layer until only the selenium in the layer adjacent the substrate crystallizes to form a continuous substantially uniform crystalline layer having a thickness up to about one micrometer. A thin protective overcoating layer can be applied on the photoconductive insulating layer. The selenium-arsenic alloy may be partially crystallized by placing the selenium alloy in shot form in a crucible in a vacuum coater and heating to between about 93° C.(200° F.) and about 177° C.(350° F.) for between about 20 minutes and about one hour to increase crystallinity and avoid reticulation. Preferably, the selenium-arsenic alloy material in shot form is heated until from about 2 percent to about 90 percent by weight of the selenium in the alloy is crystallized. The selenium-arsenic alloy material shot may be crystallized completely prior to vacuum deposition to ensure that a uniform starting point is employed. However, if desired, a completely amorphous alloy may be used as the starting material for vacuum deposition. In Examples II and V of this copending patent application, halogen doped selenium-arsenic alloy shot containing about 0.35 percent by weight arsenic, about 11.5 parts per million by weight chlorine, and the remainder selenium, based on the total weight of the alloy, was heat aged at 121° C.(250° F.) for 1 hour in crucibles in a vacuum coater to crystallize the selenium in the alloy. After crystallization, the selenium alloy was evaporated from chrome coated stainless steel crucibles at an evaporation temperature of between about 204° C.(400° F.) and about 288° C.(550° F.).

Now U.S. Pat. No. 4,780,386, the disclosure of which is totally incorporated herein by reference, illustrates a process wherein the surfaces of large particles of an alloy comprising selenium, tellurium and arsenic, the particles having an average particle size of at least 300 micrometers and an average weight of less than about 1,000 milligrams, are mechanically abraded while maintaining the substantial surface integrity of the large particles to form between about 3 percent by weight to about 20 percent by weight dust particles of the alloy based on the total weight of the alloy prior to mechanical abrasion. The alloy dust particles are substantially uniformly compacted around the outer periphery of the large particles of the alloy. The large particles of the alloy may be beads of the alloy having an average particle size of between about 300 micrometers and about 3,000 micrometers or pellets having an average weight between about 50 milligrams and about 1,000 milligrams, the pellets comprising compressed finely ground particles of the alloy having an average particle size of less than about 200 micrometers prior to compression. In one embodiment, the process disclosed in this copending application comprises mechanically abrading the surfaces of beads of an alloy comprising selenium, tellurium and arsenic having an average particle size of between about 300 micrometers and about 3,000 micrometers while maintaining the substantial surface integrity of the beads to form a minor amount of dust particles of the alloy, grinding the beads and the dust particles to form finely ground particles of the alloy, and compressing the ground particles into pellets having an average weight between about 50 milligrams and about 1,000 milligrams. In another embodiment of the copending application, mechanical abrasion of the surface of the pellets after the pelletizing step may be substituted for mechanical abrasion of the beads. The process includes providing beads of an alloy comprising selenium, tellurium and arsenic having an average particle size of between about 300 micrometers and about 3,000 micrometers, grinding the beads to form finely ground particles of the alloy having an average particle size of less than about 200 micrometers, compressing the ground particles into pellets having an average weight between about 50 milligrams and about 1,000 milligrams, and mechanically abrading the surface of the pellets to form alloy dust particles while maintaining the substantial surface integrity of the pellets.

In U.S. Pat. No. 4,822,712, the disclosure of which is totally incorporated herein by reference, there is illustrated a process for controlling fractionation. More specifically, there is disclosed in this copending application processes for crystallizing particles of an alloy of selenium comprising providing particles of an alloy comprising amorphous selenium and an alloying component selected from the group consisting of tellurium, arsenic, and mixtures thereof, said particles having an average size of at least about 300 micrometers and an average weight of less than about 1,000 milligrams, forming crystal nucleation sites on at least the surface of said particles while maintaining the substantial integrity of said particles, heating the particles to at least a first temperature between about 50° C. and about 80° C. for at least about 30 minutes to form a thin, substantially continuous layer of crystalline material at the surface of the particles while maintaining the core of selenium alloy in said particles in an amorphous state, and rapidly heating said particles to at least a second temperature below the softening temperature of said particles, the second temperature being at least 20° C. higher than the first temperature and between about 85° C. and about 130° C. to crystallize at least about 5 percent by weight of said amorphous core of selenium alloy in the particles. With the process of the present invention, there is initially accomplished the crystallization or partial crystallization as illustrated, for example, in the appropriate aforementioned copending applications.

Further, in copending application U.S. Ser. No. 07/261,659, filed Oct. 24, 1988 entitled Processes for Suppressing the Fractionation of Chalcogenide Alloys with the listed inventors Santokh S. Badesha, Paul Cherin and Harvey J. Hewitt, the disclosure of which is totally incorporated herein by reference, there is illustrated a process for the preparation of chalcogenide alloy compositions which comprises providing a chalcogenide alloy; admixing therewith crystalline or amorphous selenium; and subsequently subjecting the resulting mixture to evaporation.

There is illustrated in U.S. Pat. No. 4,513,031 a process for the formation of an alloy layer on the surface of a substrate, which for example comprises forming in a vessel a molten bath comprising at least one vaporizable alloy component having a higher vapor pressure than at least one other vaporizable alloy component in the bath; forming a thin substantially inert liquid layer of an evaporation retarding film on the upper surface of the molten bath, the liquid layer of the evaporation retarding film having a lower or comparable vapor pressure than both the vaporizable alloying component having a higher vapor pressure and the other vaporizable alloying component; covaporizing at least a portion of both the vaporizable alloying component having a higher vapor pressure and the other vaporizable alloying component whereby the evaporation retarding film retards the initial evaporation of the vaporizable alloying component having a higher vapor pressure, and forming an alloy layer comprising both the vaporizable alloying component having a higher vapor pressure and the other vaporizable alloying component on the substrate, see column 3, lines 33 to 54, for example. Examples of vaporizable alloying components include selenium-sulfur and the like; and examples of vaporizable alloying components having relatively low vapor pressures which include tellurium, arsenic, antimony, bismuth, and the like are illustrated in column 4, reference for example lines 41 to 50. Examples of suitable evaporation retarding film materials are outlined in column 4, at line 54, and continuing onto column 5, line 36, such materials including long chain hydrocarbon oils, inert oils, greases or waxes at room temperature which readily flow at less than the temperature of detectable deposition of the vaporizable alloying components having higher vapor pressures in the alloying mixture. Examples of retarding materials include lanolin, silicone oils such as dimethylpolysiloxane, branched or linear polyolefins such as polypropylene wax and polyalpha olefin oils, and the like, see column 5. According to the teachings of this patent, optimum results are achieved with high molecular weight long chain hydrocarbon oils and greases generally refined by molecular distillation to have a low vapor pressure at the alloy deposition temperature, see column 5, lines 32 to 36. It is believed with the aforementioned process that the levels of organics which are incorporated into the resulting alloy film may be sufficiently high causing negative adverse effects in the electrical properties of the resulting photoreceptor, for example, residual potential, dark decay, charge trapping, and cyclic stability are adversely effected. These and other problems are avoided with the process of the present invention. Moreover, there is no teaching in this patent with respect to initially crystallizing, or partially crystallizing the source component, and thereafter vacuum evaporating this component in the presence of a hydrocarbon, silicones, lanolins, which are a mixture of polyalcohols, polyesters, and fatty acids, especially the addition of these materials at low levels, that is from about 10 to about 30 parts per million thereby enabling photoreceptors with lower concentrations of organic materials thus permitting the advantages of the present invention, and avoiding those disadvantages as illustrated in the prior art such as the '031 patent, including, it is believed, the ineffective control of fractionation when low levels of organic additives, such as, for example, from about 10 to about 30 parts per million are selected.

In addition to the U.S. Pat. No. 4,205,098 discussed herein, there were located as a result of a patentability search U.S. Pat. No. 4,583,608, which discloses methods of heat treating a single crystal super alloy, and more specifically a means is disclosed therein to heat treat an alloy at a temperature below, but within about 25° of the start of its melting temperature for a period of a time sufficient to achieve alloy homogenization, reference column 3, lines 40 to 47; 4,585,621; 4,632,849; 4,484,945; 4,414,179; 4,015,029; and 3,785,806; and Swiss Pat. No. CH 656846 A5; Japanese Pat. Nos. 60-172346, and 57-91567.

Also, there is described in U.S. Pat. No. 4,205,098 a process wherein a powdery material of selenium alone or at least with one additive is compacted under pressure to produce tablets, the tablets being degassed by heating at an elevated temperature below the melting point of the metallic selenium and thereafter using the tablets as a source for vacuum deposition. The tablets formed by compacting the powdery selenium under pressure may be sintered at a temperature between about 100° C. and about 220° C. Typical examples of sintering conditions include 210° C. for between about 20 minutes and about 1 hour, and about 1 to about 4 hours at 100° C. depending upon compression pressure. Additives mentioned include Te, As, Sb, Bi, Fe, Tl, S, I, F, Cl, Br, B, Ge, PbSe, CuO, Cd, Pb, $BiCl_3$, $SbS_3$, $Bi_2S_3$, Zn, CdS, CdSeS and the like.

Furthermore, in U.S. Pat. No. 4,609,605 there is illustrated a multilayered electrophotographic imaging member wherein one of the layers may comprise a selenium-tellurium-arsenic alloy prepared by grinding selenium-tellurium-arsenic alloy beads, with or without halogen doping, preparing pellets having an average diameter of about 6 millimeters from the ground material, and evaporating the pellets in crucibles in a vacuum coater; and in U.S. Pat. No. 4,297,424 there is described a process for preparing a photoreceptor wherein selenium-tellurium-arsenic alloy shot is ground, formed into pellets and vacuum evaporated.

There is illustrated in U.S. Pat. No. 4,554,230 a method for fabricating a photoreceptor wherein selenium-arsenic alloy beads are ground, formed into pellets and vacuum evaporated. Also, the following U.S. Pat. Nos. are mentioned: 3,524,754 directed to a process for preparing a photoreceptor wherein selenium-arsenic-antimony alloys are ground into fine particles and vacuum evaporated; 4,710,442 relating to an arsenic-selenium photoreceptor wherein the concentration of arsenic increases from the bottom surface to the top surface of the photoreceptor such that the arsenic concentration is about 5 weight percent at a depth about 5 to 10 microns on the top surface of the photoreceptor and is about 30 to 40 weight percent at the top surface of the photoreceptor, which photoreceptor can be prepared by heating a mixture of selenium-arsenic alloys in a vacuum in a step-wise manner such that the alloys are consequentially deposited on the substrate to form a photoconductive film with an increasing concentration of arsenic from the substrate interface to the top surface of the photoreceptor. In one specific embodiment, a mixture of 3 selenium-arsenic alloys are maintained at an intermediate temperature in the range of from about 100° to 130° C. for a period of time sufficient to dry the mixture; and 4,583,608 relating to the heat treatment of single crystal superalloy particles by using a heat treatment cycle during the initial stages of which incipient melting occurs within the particles being treated. During a subsequent step in heat treatment process, substantial diffusion occurs in the particle. In a related embodiment, single crystal particles which have previously undergone incipient melting during a heat treatment process are prepared by a heat treatment process. Other prior art includes U.S. Pat. Nos. 4,585,621; 4,632,849; 4,414,179; 4,015,029 and 3,785,806.

SUMMARY OF THE INVENTION

It is an object of the present invention to provide processes for the preparation of chalcogenide alloys.

Another object of the present invention is the provision of processes for the preparation of chalcogenide alloys wherein fractionation is minimized or controlled.

Further, in another object of the present invention there are provided processes for the preparation of selenium alloys wherein fractionation of such alloys when evaporated is substantially avoided.

It is a further object of the present invention to provide an improved process which controls arsenic and tellurium fractionation within specific ranges.

It is a further object of the present invention to provide an improved process wherein components such as organic materials, including organic polymers in low effective amounts such as siloxane polymers and hydrocarbons, are added to a crystallized or partially crystallized chalcogenide alloy prior to or during the vacuum evaporation of said alloy.

Moreover, in a further object of the present invention there are provided processes wherein small amounts of organic materials, including siloxane polymers, are added to a crystallized or partially crystallized chalcogenide alloy source material prior to evaporation thereby controlling fractionation.

Also, in a further object of the present invention there are provided processes wherein small amounts of organic materials are added to a crystallized or partially crystallized chalcogenide alloy source materials such as selenium-arsenic, or selenium-tellurium prior to or during evaporation thereby controlling fractionation, and reducing the amount of, for example, arsenic at the top surface of the resulting photoconductor to between about 0.5 and about 1 percent, and preferably 0.8 percent, when the selenium source alloy has an arsenic content of approximately 0.5 percent by weight; or reducing the amount of tellurium at the top surface of the photoreceptor to between about 14.5 to about 17 weight percent tellurium, and preferably 15 weight percent tellurium wherein the selenium source alloy has a tellurium concentration of about 14.5 weight percent.

Additionally, in a another object of the present invention there are provided processes wherein organic materials are added to a crystallized or partially crystallized chalcogenide alloy source material, such as selenium arsenic, prior to or during the evaporation thereby forming, it is believed organo chalcogenide components which achieve a lower partial vapor pressure than the source alloy thereby preventing the loss of this component by evaporation.

It is a further object of the present invention to provide an improved process which increases photoreceptor yields.

It is a further object of the present invention to provide an improved process which reduces the level of tellurium or arsenic fractionation.

Furthermore, it is another object of the present invention to provide an improved process which reduces the tellurium or arsenic distribution variation throughout the thickness of a selenium-tellurium alloy photoconductive layer.

Another object of the present invention is to provide an improved process which controls the mechanical wear characteristics of the photoreceptor surface.

Also, it is another object of the present invention to provide processes which limit the loss of components containing selenium during the initial evaporation process.

It is a further object of the present invention to provide processes that provide evaporated films of selenium and its alloys with arsenic and/or tellurium which have, in many instances, superior photoconductive properties for extended time periods, and wherein the level of organic species or polymer are present in low amounts thereby not adversely affecting the electrical characteristics of the photoreceptor.

The above objects and other objects of the present invention are accomplished by providing a process for preparing and controlling the fractionation of chalcogenide alloys. More specifically, the present invention is directed to a process which comprises providing a chalcogenide alloy source material, crystallizing said source material, vacuum evaporating the source material, and adding in effective amounts thereto, prior to, during, or subsequent to evaporation, organic components such as siloxane polymers or greases, enabling the formation of a photoconductor with improved characteristics as illustrated herein. In one specific embodiment of the present invention, there is provided a process which comprises providing a chalcogenide alloy such as an alloy containing selenium, including selenium-arsenic and selenium-tellurium alloys; crystallizing said alloy; and vacuum evaporating the alloy by heating at a temperature of from about 250° C. to about 350° C. in the presence of an organic polymer such as a siloxane in an amount of from about 10 to about 30 parts per million, and depositing on a supporting substrate the desired chalcogenide alloy with reduced fractionation. In another specific embodiment of the present invention, there is provided a process which comprises providing a chalcogenide alloy such as an alloy containing selenium, including selenium-arsenic, and selenium-tellurium alloys; subjecting the aforesaid alloy to crystallization at a temperature of from about 85° to about 130° C.; subjecting the resulting components to evaporation by heating at a temperature of from about 250° C. to about 350° C. in the presence of from about 10 to about 30 parts per million of an organic polymer; and depositing on a supporting substrate the desired chalcogenide alloy with reduced fractionation, and containing from about 0.3 to about 2 percent by weight of arsenic or tellurium and wherein the loss of the selenium rich component is avoided.

In another specific embodiment of the present invention, there is initially prepared the source alloy reactant product by known melt quenching methods. According to this method, the desired elements in appropriate amounts are mixed in a quartz vessel and are melted at temperatures of from about 400° to about 600° C. depending, for example, on the elements selected and other reaction parameters. Effective mixing is usually accomplished by purging the aforementioned molten mass with a stream of a dry inert gas, such as nitrogen, argon, or mixtures thereof. Subsequent to heating and mixing the alloy components for an extended period of time, for example, from about 2 to about 72 hours, the molten mass resulting is shotted, for example, by pouring into cold water through a screen. There results alloy shot, for example, an alloy shot of selenium-tellurium with about 70 to 80 percent by weight of selenium, and about 30 to 20 percent by weight of tellurium; or selenium-arsenic with about 95 to 99.8 percent by weight of selenium, and about 5 to 0.2 percent by weight of arsenic. Also, the resulting diameter of the alloy shot is dependent on the screen size, and the shot is amorphous at this stage as determined by X-ray diffraction techniques (XRD). The exact composition of the alloy is usually determined by X-ray Fluorescence Spectroscopy (XRF). Examples of shot produced in this manner include selenium-arsenic alloy with about 0.5 or 2 weight percent arsenic content; SeTe alloys with 20, 12, 14.5, 25, or 30 weight percent tellurium; SeAsTe with Te 8 weight percent; As 2 weight percent; Te 10 weight percent; or As 4 weight percent. Also, the diameter of the shots usually varies between about 0.5 millimeter to about 2.5 millimeters. The resulting steel shot is then subjected to crystallization. Crystallization may be accomplished by a variety of means as indicated herein, and detailed in the aforementioned copending applications. For example, in one embodiment with regard to a selenium-tellurium alloy containing about 10 weight percent of tellurium, and about 90 percent by weight of selenium, although other amounts, and other alloys may be selected as indicated herein, for example, the alloy shots are initially abraded, for example, in a Munson Abrader for about 1 hour to generate surface nucleation sites. The abraded alloy is then added to open trays, for example metal or pyrex trays, and the trays are then placed into an oven. Subsequently, the oven temperature is increased to about 62° C. and the alloys maintained at this temperature for about 1 hour during which time the trays are shaken periodically. Thereafter, the temperature in the oven is increased to about 67° C. and maintained at this temperature for about 1 hour. The trays are then shaken again, and the temperature in the oven then further increased to about 75° C. and maintained at this temperature for about 2 hours followed by increasing the temperature in the oven to about 85° C., and maintaining this temperature for about 1 hour. Subsequently, the temperature in the oven is raised to about 102° C. and held at this temperature for about 2 hours. During the aforesaid heating steps, the trays were periodically shaken by hand, usually an average of once every 30 minutes. There results crystalline alloy shot as determined by XRD.

A solution of organic polymers, or other similar materials, such as Apiezon-L a hydrocarbon grease commercially available from VWR Scientific Inc., can be prepared by dissolving appropriate amounts of this grease in a known volume of organic solvents, for example cyclohexane, xylene, ethers, mixtures thereof and the like. Two solution concentrations containing 10 and 20 parts per million, respectively, of the Apiezon-L in cyclohexane were prepared. Subsequently, an appropriate amount, for example 50 grams of the above prepared crystalline alloy shot, can be soaked into the above solutions, about 100 milliliters for an effective period of time, preferably about 1 hour for each solution. The shot can then be removed from each of the solutions by filtration, washed with for example 20 milliliter portions of hexane twice, and thereafter the alloy shot can be air dried.

Thereafter, the resulting alloy source material dried shot can be added to crucibles in an 18 inch bell jar coater which shot was substantially evenly spread within the crucibles and coating on a substrate such as aluminum accomplished in about 20 minutes. For this coating, which is known in the art, the crucible temperature is usually maintained at about 350° C., the vacuum was maintained at $4 \times 10^{-5}$ Torr, the substrate temperature was maintained at 55° C., and the preferred aluminum substrate thickness was about 1 mil and generally up to about 100 mils in thickness. There resulted a photoreceptor film with a preferred thickness of 50 microns as measured by a Permascope. Other similar process embodiments not specifically disclosed herein may be utilized providing the objectives of the present invention are achieved.

The aforementioned process embodiment is also applicable to the preparation of other photoreceptors not specifically described herein, which photoreceptors, it is believed, possess the advantages illustrated herein. These photoreceptors can be comprised of known binary, ternary, and quaternary alloys including selenium arsenic, selenium tellurium, selenium antimony, selenium arsenic antimony, and the like.

The substrate in a thickness of up to 100 mils, and preferably from about 1 to about 50 mils, selected for the deposited chalcogenide product may be opaque or substantially transparent and may comprise numerous suitable materials having the desired mechanical properties. The entire substrate may comprise the same material such as an electrically conductive surface or the electrically conductive surface may merely be a coating on the substrate. Typical electrically conductive materials include, for example, aluminum, titanium, nickel, chromium, brass, stainless steel, copper, zinc, silver, tin, and the like. Any suitable material such as nickel may be employed, which conductive layer may vary in thickness depending on the desired use of the electrophotoconductive member. Accordingly, the conductive layer may be of a thickness from about 50 Angstroms to about 5,000 Angstroms. Generally, the substrate may be comprised of known materials including organic and inorganic materials. Examples of substrate materials include insulating nonconducting materials, such as various resins known for this purpose, including polyesters, polycarbonates, polyamides, polyurethanes, and the like. The coated or uncoated substrate, which may also be comprised of conductive components as indicated herein, may be flexible or rigid and may have any number of configurations such as, for example, a plate, a cylindrical drum, a scroll, an endless flexible belt, and the like. The outer surface of the supporting substrate preferably comprises a metal oxide such as aluminum oxide, nickel oxide, titanium oxide, and the like.

In some situations intermediate adhesive layers between the substrate and subsequently applied layers may be desirable to improve adhesion. Preferably these layers have a dry thickness between about 0.1 micrometer to about 5 micrometers. Examples of adhesive layers include film-forming polymers such as polyester, polyvinylbutyral, polyvinylpyrrolidone, polycarbonate, polyurethane, polymethylmethacrylate, and the like, and mixtures thereof.

Any suitable photoconductive chalcogenide alloy may be selected for the process of the present invention including binary, ternary, quaternary alloys, and the like, in effective amounts of, for example, from about 40 grams to about 55 grams when preparing a 50 to 55 micron thick 4 inch by 6 inch alloy thin film, may be employed as the source alloy to enable the formation of the vacuum deposited photoconductive layer. Preferred alloys include alloys of selenium with tellurium, arsenic, or tellurium and arsenic with or without a halogen dopant. Examples of photoconductive alloys of selenium include selenium-tellurium, selenium-arsenic, selenium-tellurium-arsenic, selenium-tellurium-chlorine, selenium-arsenic-chlorine, selenium-tellurium-arsenic-chlorine alloys, and the like. Generally, the selenium-tellurium alloy may comprise between about 5 percent by weight and about 40 percent by weight tellurium and a halogen selected from the group consisting of up to about 70 parts per million by weight of chlorine and up to about 140 parts per million by weight of iodine all based on the total weight of the alloy with the remainder being selenium. The selenium-arsenic alloy may, for example, comprise between about 0.01 percent by weight and about 35 percent by weight arsenic and a halogen selected from the group consisting of up to about 200 parts per million by weight of chlorine and up to about 1,000 parts per million by weight of iodine all based on the total weight of the alloy with the remainder being selenium. The selenium-tellurium-arsenic alloy may comprise between about 5 percent by weight and about 40 percent by weight tellurium, between about 0.1 percent by weight and about 5 percent by weight arsenic and a halogen selected from the group consisting of up to about 200 parts per million by weight of chlorine and up to about 1,000 parts per million by weight of iodine all based on the total weight of the alloy with the remainder being selenium. The expressions alloy of selenium and selenium alloy are intended to include halogen doped alloys as well as alloys not doped with halogen. The thickness of the aforementioned photoconductive chalcogenide alloy layer is generally between about 0.1 micrometer and about 400 micrometers. Other thicknesses may be selected provided the objectives of the present invention are achieved.

Crystallization or partial crystallization can be accomplished as illustrated herein and in the aforementioned copending applications U.S. Pat. No. 4,822,712, the disclosure of which is totally incorporated herein by reference. Vacuum evaporation involves as indicated herein, for example, heating from a crucible the source component at a temperature of from about 250° C. to about 350° C.

Illustrative examples of organic components or polymers in an amount of from about 5 to about 50 parts per million, and preferably from about 10 to about 30 parts per million, selected for the process of the present invention include siloxane polymers, hydrocarbons such as Apiezon-L, Lanolin, mixtures thereof, and the like. Many of these components are illustrated in the U.S. Pat. No. 4,513,031, see column 5 for example, the disclosure of this patent being totally incorporated herein by reference, and the like.

Selenium-tellurium and selenium-tellurium-arsenic alloy photoconductive layers are frequently employed as a charge generation layer in combination with a charge transport layer. The charge transport layer is usually positioned between a supporting substrate and the charge generating selenium alloy photoconductive layer. Generally, a selenium-tellurium alloy may comprise from about 60 percent by weight to about 95 percent by weight selenium and from about 5 percent by weight to about 40 percent by weight tellurium based on the total weight of the alloy. The selenium-tellurium alloy may also comprise other components such as less than about 35 percent by weight arsenic to minimize crystallization of the selenium and less than about 1,000 parts per million by weight halogen. In a more preferred embodiment, the photoconductive charge generating selenium alloy layer comprises between about 5 percent by weight and about 25 percent by weight tellurium, between about 0.1 percent by weight and about 4 percent by weight arsenic, and a halogen selected from the group consisting of up to about 100 parts per million by weight of chlorine and up to about 300 parts per million by weight of iodine with the remainder being selenium. Elevated levels of arsenic in some applications, above about 4 percent by weight, can result in high dark decay, problems in cycling stability, and problems with reticulation of the photoreceptor surface. The resistance of amorphous selenium photoreceptors to thermal crystallization and surface wear begins to degrade as the concentration of arsenic drops below about 1 percent by weight. As the chlorine content rises above about 70 parts per million by weight chlorine, the photoreceptor begins to exhibit excessive dark decay.

Any suitable selenium alloy transport layer may be utilized in the aforementioned layered imaging member. Examples of these layers include pure selenium, selenium-arsenic alloys, selenium-arsenic-halogen alloys, selenium-halogen and the like. Preferably, the charge transport layer comprises a halogen doped selenium arsenic alloy. Generally, about 10 parts by weight per million to about 200 parts by weight per million of halogen is present in a halogen doped selenium charge transport layer. When the halogen doped transport layer free of arsenic is utilized, the halogen content should normally be less than about 20 parts by weight per million. Inclusion of high levels of halogen in a thick halogen doped selenium charge transport layer free of arsenic may cause excessive dark decay. Imaging members containing high levels of halogen in a thick halogen doped selenium charge transport layer free of arsenic are described, for example, in U.S. Pat. Nos. 3,635,705 and 3,639,120, and Ricoh Japanese Patent Publication No. J5 61 42-537 published Jun. 6, 1981, the disclosures of which are totally incorporated herein by reference. Generally, halogen doped selenium arsenic alloy charge transport layers comprise between about 99.5 percent by weight to about 99.9 percent by weight selenium, about 0.1 percent to about 0.5 percent by weight arsenic, and between about 10 parts per million by weight to about 200 parts per million by weight of halogen, the latter halogen concentration being a nominal concentration. Halogen includes fluorine, chlorine, bromine, and iodine. Chlorine is preferred primarily because of its stability. Transport layers are described, for example, in U.S. Pat. Nos. 4,609,605 and 4,297,424, the disclosures of which are totally incorporated herein by reference.

The first layer of multiple layered photoreceptors, such as a transport layer, may be deposited by any suitable conventional technique, such as vacuum evaporation. Thus, a transport layer comprising a halogen doped selenium-arsenic alloy comprising less than about 1 percent arsenic by weight may be evaporated by conventional vacuum coating devices to form the desired thickness. The amount of alloy to be employed in the evaporation boats of the vacuum coater will depend on the specific coater configuration and other process variables to achieve the desired transport layer thickness. Chamber pressure during evaporation may be on the order of about $4 \times 10^{-5}$ Torr. Evaporation is normally completed in about 15 to 25 minutes with the molten alloy temperature ranging from about 250° C. to about 325° C. Other times and temperatures and pressures outside these ranges may be used as well understood by those skilled in the art. It is generally desirable that the substrate temperature be maintained in the range of from about 50° C. to about 70° C. during deposition of the transport layer. Additional details for the preparation of transport layers are disclosed, for example, in U.S. Pat. No. 4,297,424.

The photoreceptors of the present invention can be selected for known imaging and printing processes, reference for example U.S. Pat. Nos. 4,265,990; 4,544,618; 4,560,635; and 4,298,672, the disclosures of each of these patents being totally incorporated herein by reference. In some of these processes, latent images formed on the alloy photoreceptor product with the process of the present invention are developed, transferred to a suitable substrate such as paper, and fixed thereto by, for example, heating.

In another embodiment of the present invention, there is provided a process for the preparation of chalcogenide alloys which comprises providing a chalcogenide alloy source component; crystallizing the source component; and evaporating the source component in the presence of an organic component. Further, in yet another embodiment of the present invention there is provided a process for controlling the fractionation of selenium alloys, which comprises providing a selenium alloy, crystallizing the alloy, and evaporating the alloy component in the presence of an organic component. Also, other specific embodiments include, for example, a process for the preparation of chalcogenide alloys, which comprises admixing a crystallized chalcogen alloy and an organic component, and evaporating the mixture resulting; and a process for controlling the fractionation of chalcogenide alloys, which comprises admixing a crystallized chalcogen alloy and an organic component, and evaporating the mixture resulting.

The following examples are being submitted to further define various species of the present invention. These examples are intended to be illustrative only and are not intended to limit the scope of the present invention. Also, parts and percentages are by weight unless otherwise indicated.

EXAMPLE I

Selenium-tellurium (Se-Te), 10 weight percent of tellurium, and 90 weight percent of selenium alloy shots (50 pounds) were prepared by mixing 45 pounds of high purity (99.999) selenium and 5 pounds of high purity (99.999) tellurium in a quartz vessel. The contents of the vessel were then heated at 450° C. at which temperature a molten mass resulted. The agitation of the molten mass was accomplished by purging it with nitrogen gas. The purging and heating were continued for 8 hours after which time the molten mass was poured into cold water (25° C.) through a stainless steel wire gauge. The resulting product of alloy shots was collected and dried. An XRF (X-ray Fluorescence) analysis indicated the composition to be comprised of a selenium-tellurium alloy (Se-Te), 10 percent by weight of tellurium and 90 percent by weight of selenium. XRD (X-ray diffraction) analysis indicated the above alloy shots to be amorphous. Fifty (50) grams of the above shots were loaded into the crucibles of an 18 inch bell jar coater and a 50 micron alloy product thick film (90/10 Se-Te) was coated on an aluminum substrate, about 1 mil thick, by maintaining the crucible temperature of 350° C., the substrate temperature at 55° C., and a vacuum of $4 \times 10^{-5}$ Torr. The alloy product film thickness of 50 microns was determined by Permascope. The EMPA (electron microprobe analysis) indicated that the average concentration of tellurium on the top 0.1 micron and 0.5 micron surface of the alloy film product was 41.7 percent and 35.0 percent, respectively. Also, EMPA analysis indicated that the distribution of tellurium concentration varied greatly from the top (41.7, 35.0) to the bottom of the alloy film product, thus indicating severe fractionation.

EXAMPLE II

Fifty (50) grams of the Se-Te (10 percent by weight of Te) amorphous alloy shots prepared by the process of Example I were soaked in a 100 milliliter solution containing 10 parts per million by weight of Apiezon-L in hexane for 1 hour. The alloy shots were then filtered and air dried. A 50 micron thick film alloy product, 90/10 Se-Te, was then deposited on the aluminum substrate in an 18 inch bell jar vacuum coater by repeating the process of Example I. EMPA analysis indicated that the average concentration of tellurium on the top 0.1 micron and 0.5 micron of the vacuum deposited film was 16.8 percent and 16.0 percent, respectively. Also, the EMPA analysis indicated that the alloy product film had inhomogeneous distribution of the tellurium throughout the resulting alloy film product, and thus considerable tellurium fractionation.

EXAMPLE III

A. Five (5) pounds of amorphous Se-Te (10 percent by weight of Te, and 90 percent by weight of selenium) alloy shots prepared by the process of Example I were fully crystallized by abrading in a Munson Abrader for 1 hour and heating by placing the resulting alloy shots into open metal trays, and the trays were heated in an oven under ambient air flow at 62° C. for 1 hour. Within this time, the surface of the shots turned shiny. The temperature of the oven was then increased to 67° C. and the shots maintained at 62° C. for 30 minutes. The tray containing these shots was shaken 3 times during this 30 minute period. The temperature was then raised to 75° C. and the shots maintained at 75° C. for 1 hour. The temperature was then increased to 85° C. for 1 hour, followed by increasing to 95° C. for 30 minutes. Finally, the temperature was increased to 104° C. for 1 hour. XRD (X-ray diffraction) indicated that the resulting selenium-tellurium (90/10) alloy was completely crystalline.

B. Fifty (50) grams of the above crystalline alloy shots were then loaded into a crucible of an 18 inch bell jar vacuum coater. These shots were spread evenly on the bottom of the crucible with a spatula. An aluminum sheet, which was 1 mil thick, was used as a substrate. A thin Se-Te (90/10) film was vacuum deposited on the substrate at 350° C. crucible temperature, $4 \times 10^{-5}$ Torr pressure, and 55° C. substrate temperature. After the coating was completed, the thickness of the selenium-tellurium (90/10) alloy film as determined by Permascope was found to be 50 microns. EMPA (electron microprobe analysis) indicated the average concentration of tellurium at the top 0.1 and 0.5 micron of the alloy film product (90/10 Se-Te) to be 11.4 percent and 12.5 percent, respectively. In addition, EMPA analysis also indicated that the alloy film product had a homogeneous distribution of tellurium throughout the film product, thus fractionation was minimized.

EXAMPLE IV

A 100 millimeter solution in cyclohexane containing 10 parts per million by weight of Apiezon-L grease was prepared. Apiezon-L was purchased from James G. Biddle Company. Fifty (50) grams of the crystallized alloy shots of Example III A. were soaked in the above Apiezon-L solution for 1 hour. After decantation, the alloy shots were dried in air and loaded into crucibles of an 18 inch bell jar vacuum coater. Coating was accomplished by repeating the coating process of Example III B. The Se-Te film thickness, as determined by a Permascope, was found to be 50 microns. EMPA indicated the average concentration of tellurium at the top 0.1 micron and 0.5 micron of the alloy film, Se-Te (90 weight percent of selenium/10 weight percent of tellurium), to be 10.5 percent and 12.0 percent, respectively. Also, EMPA analysis indicated the alloy film Se-Te (90/10) product had a homogeneous distribution of tellurium throughout the film product, and no fractionation.

EXAMPLE V

The process of Example IV was repeated with the exception that the alloy shots were doped with Apiezon-L grease by soaking in 100 milliliters of hexane solution containing 20 parts per million by weight of Apiezon-L grease. The average tellurium concentration at the top 0.1 micron and 0.5 micron as determined by EMPA was found to be 10.8 percent and 11.5 percent, respectively. Also, EMPA analysis indicated the alloy film product Se-Te (90/10) had a homogeneous distribution of tellurium throughout the film product and no fractionation.

Although the invention has been described with reference to specific preferred embodiments, it is not intended to be limited thereto, rather those skilled in the art will recognize that variations and modifications may be made therein which are within the scope of the present invention and within the scope of the claims.

What is claimed is:

1. A process for the preparation of chalcogenide alloys which comprises providing a chalcogenide alloy source component, crystallizing the source component, admixing the crystallized source component with an organic component, and evaporating the source component in the presence of the organic component.

2. A process for controlling the fractionation of selenium alloys which comprises providing a selenium alloy, crystallizing the alloy, admixing the crystallized alloy with an organic component, and evaporating the alloy in the presence of the organic component.

3. A process in accordance with claim 2 wherein the alloy is comprised of selenium arsenic, selenium tellurium, or selenium tellurium arsenic.

4. A process in accordance with claim 2 wherein the organic component is present in an amount of from about 5 to about 50 parts per million.

5. A process in accordance with claim 2 wherein the organic component is a polymer, a siloxane, or a hydrocarbon.

6. A process in accordance with claim 2 wherein the crystallization is accomplished at a temperature of from about 85 to about 135° C.

7. A process in accordance with claim 2 wherein there results a selenium arsenic alloy with from about 0.3 to about 2 percent by weight of arsenic.

8. A process in accordance with claim 2 wherein there results a selenium-tellurium alloy with from about 5 to about 40 percent by weight of tellurium.

9. A process in accordance with claim 1 wherein there is deposited on a substrate subsequent to evaporation a chalcogenide alloy with reduced fractionation.

10. A process in accordance with claim 2 wherein there is deposited on a substrate subsequent to evaporation a chalcogenide alloy with reduced fractionation.

11. A photoreceptor comprised of the chalcogenide alloy of claim 1.

12. A photoreceptor comprised of the chalcogenide alloy of claim 2.

13. A photoreceptor comprised of the chalcogenide alloy of claim 1 as a photogenerator, and a charge transport layer.

14. A photoreceptor comprised of the chalcogenide alloy of claim 2 as a photogenerator, and a charge transport layer.

15. A process for controlling the fractionation of selenium alloys which comprises providing a selenium alloy, crystallizing the alloy, admixing the crystallized alloy with an organic component, and evaporating the alloy in the presence of the organic component, wherein said component is present in an amount of from about 5 to about 50 parts per million.

16. A process in accordance with claim 15 wherein said component is present in an amount of from about 10 to about 30 parts per million.

17. A process in accordance with claim 16 wherein the component is a polymer, a siloxane or a hydrocarbon.

18. A process in accordance with claim 17 wherein the polymer is Apiezon-L.

19. A process for the preparation of chalcogenide alloys which comprises providing a chalcogenide alloy source component, crystallizing the alloy, admixing the crystallized source component with an organic component, and evaporating the alloy in the presence of the organic component.

20. A process in accordance with claim 1 wherein the crystalline alloy is comprised of selenium-tellurium with about 10 weight percent of tellurium, and about 90 weight percent of selenium.

21. A process in accordance with claim 1 wherein the product contains a halogen.

22. A process in accordance with claim 21 wherein the halogen is present in an amount of from about 10 to about 200 parts per million.

23. A process in accordance with claim 21 wherein the halogen is chlorine.

24. A process in accordance with claim 19 wherein the organic component is present in an amount of from about 10 to about 30 parts per million.

25. A process in accordance with claim 19 wherein the organic component is an organic polymer.

26. A process in accordance with claim 19 wherein the organic component is a siloxane or a hydrocarbon.

27. A process in accordance with claim 1 wherein the alloy source component is partially crystallized.

28. A process in accordance with claim 2 wherein the alloy is partially crystallized.

29. A process in accordance with claim 15 wherein the alloy is partially crystallized.

30. A process in accordance with claim 19 wherein the alloy is partially crystallized.

31. A process in accordance with claim 1 wherein vacuum evaporation is selected.

32. A process in accordance with claim 2 wherein vacuum evaporation is selected.

33. A process in accordance with claim 15 wherein vacuum evaporation is selected.

34. A process in accordance with claim 19 wherein vacuum evaporation is selected.

35. A process for controlling the fractionation of chalcogenide alloys which comprises admixing a crystallized chalcogen alloy and an organic component, and evaporating the mixture resulting.

* * * * *